(12) United States Patent
Kim et al.

(10) Patent No.: US 7,972,914 B2
(45) Date of Patent: Jul. 5, 2011

(54) SEMICONDUCTOR DEVICE WITH FINFET AND METHOD OF FABRICATING THE SAME

(75) Inventors: Sung-min Kim, Incheon Metropolitan (KR); Min-sang Kim, Seoul (KR); Eun-jung Yun, Seoul (KR)

(73) Assignee: Samsung Electronics Co., Ltd. (KR)

( * ) Notice: Subject to any disclaimer, the term of this patent is extended or adjusted under 35 U.S.C. 154(b) by 57 days.

(21) Appl. No.: 12/477,348

(22) Filed: Jun. 3, 2009

(65) Prior Publication Data

US 2009/0239346 A1    Sep. 24, 2009

Related U.S. Application Data

(62) Division of application No. 11/403,986, filed on Apr. 13, 2006, now abandoned.

(30) Foreign Application Priority Data

Apr. 14, 2005  (KR) ......................... 10-2005-0030947

(51) Int. Cl.
*H01L 21/338*   (2006.01)
*H01L 21/336*   (2006.01)
*H01L 21/3205*  (2006.01)

(52) U.S. Cl. ........ 438/173; 438/268; 438/270; 438/589; 257/E21.429; 257/E21.628

(58) Field of Classification Search ................... 438/270, 438/589, 173, 268; 257/E21.429, E21.628
See application file for complete search history.

(56) References Cited

U.S. PATENT DOCUMENTS

| | | | | |
|---|---|---|---|---|
| 6,027,978 A | * | 2/2000 | Gardner et al. | 438/289 |
| 6,137,141 A | | 10/2000 | Son et al. | |
| 6,268,289 B1 | * | 7/2001 | Chowdhury et al. | 438/687 |
| 6,303,448 B1 | * | 10/2001 | Chang et al. | 438/300 |
| 6,391,782 B1 | | 5/2002 | Yu | |

(Continued)

FOREIGN PATENT DOCUMENTS

JP            10-284432         10/1998

(Continued)

OTHER PUBLICATIONS

"Semiconductor Memory Device with FinFET and Method of Fabricating the Same" Specification, Drawings, and Prosecution History of U.S. Appl. No. 11/403,986, filed Apr. 13, 2006, by Sung-min Kim, et al.

*Primary Examiner* — Walter L Lindsay, Jr.
*Assistant Examiner* — Ron Pompey
(74) *Attorney, Agent, or Firm* — Mills & Onello, LLP

(57) ABSTRACT

A FinFET semiconductor device has an active region formed of a semiconductor substrate and projecting from a surface of the substrate. A fin having a first projection and a second projection composed of the active region are arranged in parallel and at each side of a central trench formed in a central portion of the active region. Upper surfaces and side surfaces of the first projection and the second projection comprise a channel region. A channel ion implantation layer is provided at a bottom of the central trench and at a lower portion of the fin. A gate oxide layer is provided on the fin. A gate electrode is provided on the gate oxide layer. A source region and a drain region are provided in the active region at sides of the gate electrode. A method of forming such a device is also provided.

17 Claims, 12 Drawing Sheets

U.S. PATENT DOCUMENTS

| | | |
|---|---|---|
| 6,664,582 B2 | 12/2003 | Fried et al. |
| 7,217,623 B2 * | 5/2007 | Kim et al. ............... 438/283 |
| 7,394,116 B2 | 7/2008 | Kim et al. |
| 7,534,708 B2 * | 5/2009 | Kim et al. ............... 438/589 |
| 7,564,105 B2 * | 7/2009 | Chi et al. ............... 257/401 |
| 7,700,456 B2 * | 4/2010 | Mikasa ............... 438/424 |
| 7,718,493 B2 * | 5/2010 | Lee ............... 438/270 |
| 2005/0285204 A1 * | 12/2005 | Kim et al. ............... 257/368 |
| 2008/0142881 A1 * | 6/2008 | Mikasa ............... 257/330 |

FOREIGN PATENT DOCUMENTS

JP 2000-100933 4/2000

\* cited by examiner

SEMICONDUCTOR DEVICE WITH FINFET AND METHOD OF FABRICATING THE SAME

CROSS-REFERENCE TO RELATED PATENT APPLICATION

This application is a divisional of U.S. application Ser. No. 11/403,986, filed on Apr. 13, 2006, which relies for priority upon Korean Patent Application No. 10-2005-0030947, filed on Apr. 14, 2005, the contents of which are herein incorporated by reference in their entirety.

BACKGROUND OF THE INVENTION

1. Field of the Invention

The present invention relates to a semiconductor device and a method of fabricating the same, and more particularly to a semiconductor device with a Fin Field Effect Transistor (FinFET) and a method of fabricating the same.

2. Description of the Related Art

Integration density of semiconductor devices continues to increase in order to improve performance and to reduce manufacturing costs. In order to increase the integration density, techniques that reduce a feature sizes of semiconductor devices are required. When fabricating contemporary semiconductor devices, the channel length of a Metal-Oxide-Semiconductor Field Effect Transistor (MOSFET) has been shortened to enhance the integration density and speed of semiconductor devices. However, the shortened channel length results in short channel effects that degrade active switch characteristics of the device. Moreover, because of being a planar channel device where channels are formed to be parallel with a surface of a semiconductor substrate, the MOSFET is not only unfavorable for device size reduction but also is not conducive to preventing short channel effects.

Recently introduced FinFET devices have a tri-gate structure in which a fin-shaped three-dimensional active region is formed, and a gate electrode encircles both side surfaces and an upper surface of the fin, thereby forming a channel with a three-dimensional structure instead of a planar structure. The tri-gate structure has a channel perpendicular to a surface of a substrate to increase the effective channel width, which is different from the planar MOSFET. Therefore, the short channel effects are mitigated in FINFET devices relative to the short channel effects of MOSFET devices. FinFET devices are disclosed in, e.g., U.S. Pat. Nos. 6,391,782 and 6,664,582, the disclosures of which are incorporated herein by reference.

As FinFET devices continue to become increasingly integrated, they too experience short channel effects. Accordingly, efforts to reduce the short channel effects are conducted by changing the doping profile of a channel region in the FinFET as in the MOSFET (referred to as "local channel ion implantation"). However, the conventional local channel ion implantation approach has a disadvantage in that both the source and the drain regions are doped as well as the channel region.

When an n-type FinFET is used as an example, the channel region is doped with a p-type impurity via local channel ion implantation. In this case, the p-type impurity is doped into a substrate to form a p-type ion implantation region. If the n-type source and drain are formed in a subsequent process, bottom surfaces of the n-type source and drain contact the p-type ion implantation region in which a source and a drain are formed. If the regions with mutually opposite conductivities meet to form a junction, the junction leakage current of the device can increase. Therefore, a drawback of the conventional local channel ion implantation method is that off-leakage current of the resulting device can be increased.

SUMMARY OF THE INVENTION

The present invention provides a semiconductor device including a FinFET structure without increasing the off leakage current.

The present invention also provides a method of fabricating a semiconductor device including a FinFET structure without increasing the off leakage current by improving local channel ion implantation.

In one aspect, the present invention is directed to a FinFET semiconductor device having an active region formed of a semiconductor substrate and projecting from a surface of the substrate. A fin having a first projection and a second projection composed of the active region are arranged in parallel and at each side of a central trench formed in a central portion of the active region. Upper surfaces and side surfaces of the first projection and the second projection comprise a channel region. A channel ion implantation layer is provided at a bottom of the central trench and at a lower portion of the fin. A gate oxide layer is provided on the fin. A gate electrode is provided on the gate oxide layer. A source region and a drain region are provided in the active region at sides of the gate electrode.

In one embodiment, the device further comprises a threshold voltage controlling ion implantation layer formed by doping the fin with an impurity of a conductivity type opposite to a conductivity type of an impurity used to dope the channel ion implantation layer, and formed at an upper portion of the fin in the first projection and the second projection.

In another embodiment, the device further comprises a device isolating layer about the active region at lower side surfaces of the first projection and the second projection.

In another embodiment, a width of the gate electrode is equal to or greater than that of the central trench and wherein the gate extends to cover the upper surfaces and the side surfaces of the first projection and the second projection.

In another aspect, the present invention is directed to a method of fabricating a semiconductor device including forming a dummy gate extending on an active region of a semiconductor substrate. After providing a shielding layer on the dummy gate, the shielding layer is planarized using the dummy gate as an end point. The dummy gate is selectively removed with respect to the shielding layer, and local channel ion implantation is performed to form a channel ion implantation layer within the active region using the shielding layer as an ion implantation mask. Then, the semiconductor substrate is etched using the shielding layer as an etch mask to form a central trench that exposes the channel ion implantation layer. A gate oxide layer is interposed within the central trench, and a gate electrode is formed on the gate oxide layer. Then, a source region and a drain region are formed in the active region on both sides of the gate electrode.

In one embodiment, a height of the dummy gate is equal to or greater than depths of the source region and the drain region.

In another embodiment, after forming the channel ion implantation layer, the method further comprises: doping an impurity of a conductivity type opposite that of an impurity of the channel ion implantation layer into an upper portion of the active region to form a threshold voltage controlling ion implantation layer.

In another aspect, the present invention is directed to a method of fabricating a semiconductor device comprising: forming an active region hard mask on a semiconductor substrate; etching the substrate using the active region hard mask as an etch mask to define an active region projecting from a surface of the substrate and to form a trench encircling the active region; isotropically etching the active region hard mask to form a hard mask pattern that exposes a top perimeter of the active region; filling the trench with a gap fill oxide layer, and planarizing the gap fill oxide layer using the hard mask pattern as an end point of planarization; forming a line type mask extending on the gap fill oxide layer and the hard mask pattern; patterning the gap fill oxide layer and the hard mask pattern using the line type mask as an etch mask to form a dummy pattern including at least one channel region defining pattern in a central portion thereof; providing a shielding layer on the line type mask, and planarizing the shielding layer using the line type mask as an end point of planarization; selectively removing the line type mask and the channel region defining pattern with respect to the shielding layer to form an opening that exposes a surface of the active region; local channel ion implanting via the opening to form a channel ion implantation layer within the active region; etching the active region under the opening to form a central trench in a portion of the active region including a fin channel at sides of the central trench; recessing the shielding layer and the gap fill oxide layer to provide a device isolating layer about the active region, and exposing a fin channel that has a first projection and a second projection composed of a surface of the substrate arranged in parallel and at each side of the central trench between the central trench and the device isolating layer, the upper surface regions and side surface regions of the first projection and the second projection comprising a channel region; forming a gate oxide layer on the fin; forming a gate electrode on the gate oxide layer; and forming a source region and a drain region in the active region at both sides of the gate electrodes.

In one embodiment, a sum of a height of the line type mask and a height of the channel region defining pattern is equal to or greater than depths of the source and the drain.

In another embodiment, the in the forming of the channel ion implantation layer, the shielding layer is used as an ion implantation mask.

In another embodiment, a doping energy of the local channel ion implanting is adjusted to allow impurities other than the impurities constituting the channel ion implantation layer to be doped entirely within the shielding layer or to be doped within the shielding layer and an upper surface of the active region.

In another embodiment, after forming the channel ion implantation layer, the method further comprises doping an impurity of a conductivity type opposite that of the impurity of the channel ion implantation layer into an upper portion of the active region to form a threshold voltage controlling ion implantation layer.

In another embodiment, in the forming of the threshold voltage controlling ion implantation layer the shielding layer is used as an ion implantation mask.

In another embodiment, a doping energy is adjusted to allow impurities other than the impurities constituting the threshold voltage controlling ion implantation layer to be doped within the shielding layer.

In another embodiment, the active region hard mask comprises silicon nitride, and the isotropic etching is wet etching using $H_3PO_4$.

In another embodiment, the isotropic etching is one of wet etching and dry etching using plasma.

In another embodiment, the line type mask comprises silicon oxide nitride.

In another embodiment, the shielding layer comprises silicon oxide.

In another embodiment, the shielding layer comprises High Density Plasma-CVD oxide.

In another embodiment, the device isolating layer is formed to have indented portions that expose side surfaces of the first projection and the second projection.

BRIEF DESCRIPTION OF THE DRAWINGS

The above and other features and advantages of the present invention will become more apparent by describing in detail exemplary embodiments thereof with reference to the attached drawings in which:

FIG. 12 illustrates a step subsequent to FIG. 11;

DETAILED DESCRIPTION OF THE INVENTION

Figure 1:
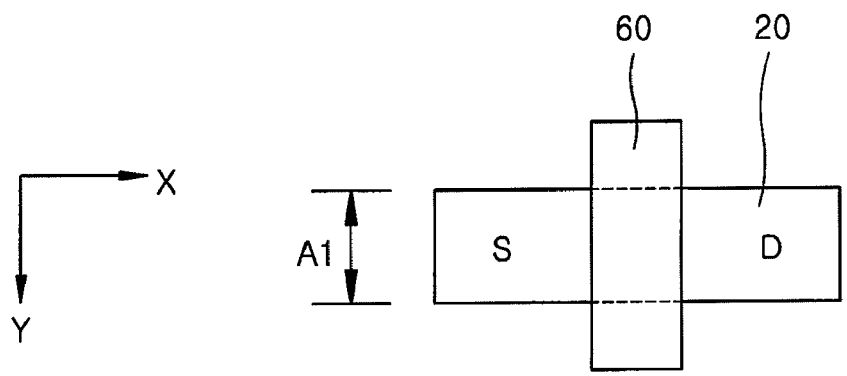
FIG. 1 illustrates a layout of a semiconductor device formed by a method of fabricating a semiconductor device according to first and second embodiments of the present invention.

The present invention will be described more fully hereinafter with reference to the accompanying drawings in which preferred embodiments of the invention are shown. This invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the forms of elements are exaggerated for clarity. To facilitate understanding, identical reference numerals have been used, where possible, to designate identical elements that are common to the figures.

First Embodiment

FIG. 1 illustrates a layout of a semiconductor device formed by a method of fabricating a semiconductor device according to first and second embodiments of the present invention. However, it will be understood by those of ordinary skill in the art that the layout of the semiconductor device according to the present invention is not necessarily limited to that shown in FIG. 1.

Referring to FIG. 1, an active region 20 is defined, and extends in one direction, e.g., X-direction, and has a predetermined width A1 in a Y-direction that is perpendicular to the X-direction. A gate electrode 60 extending in the Y-direction is formed on the active region 20. A source S and a drain D are formed in the active region 20 on both sides of the gate electrode 60.

Figure 9:
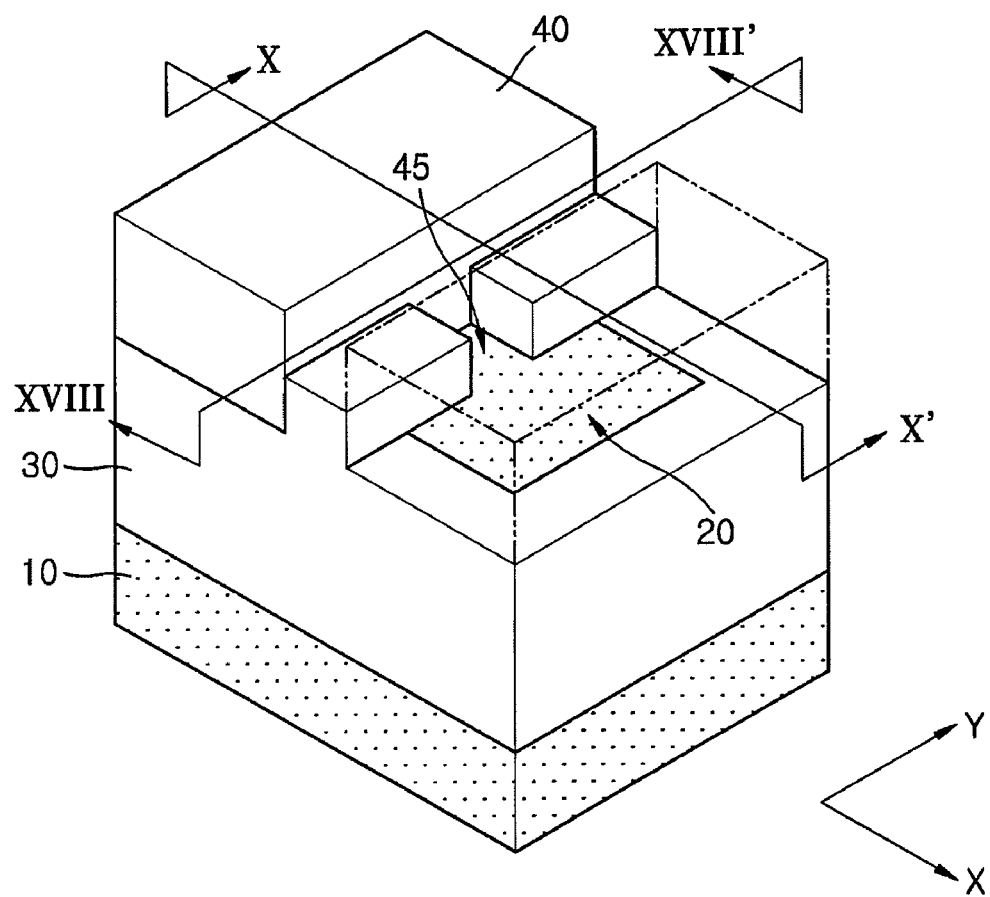
Figure 10:
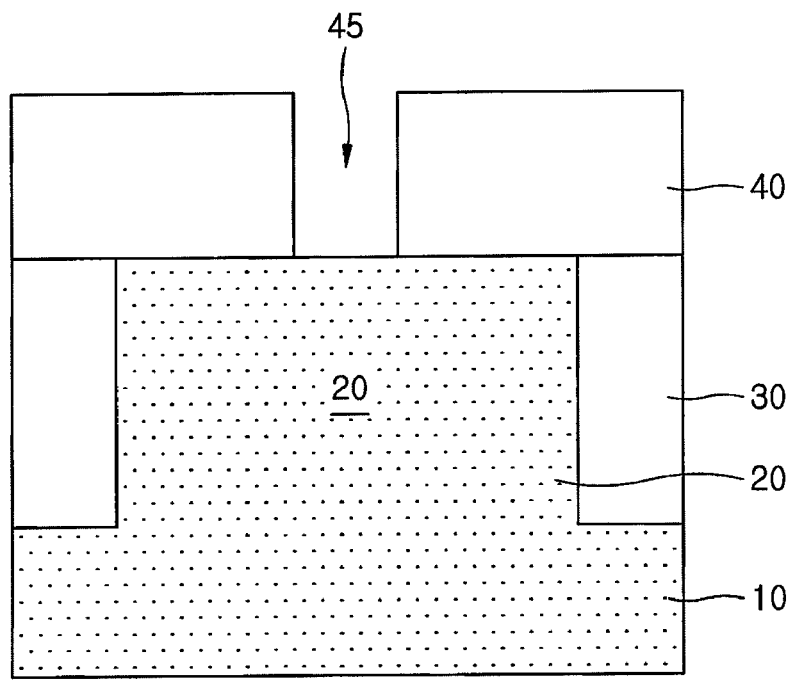
FIGS. 10 through 12 are sectional views taken along a line X-X' of FIG. 9, in which FIGS. 10 and 11 correspond to a structure illustrated in FIG. 9.
Figure 11:
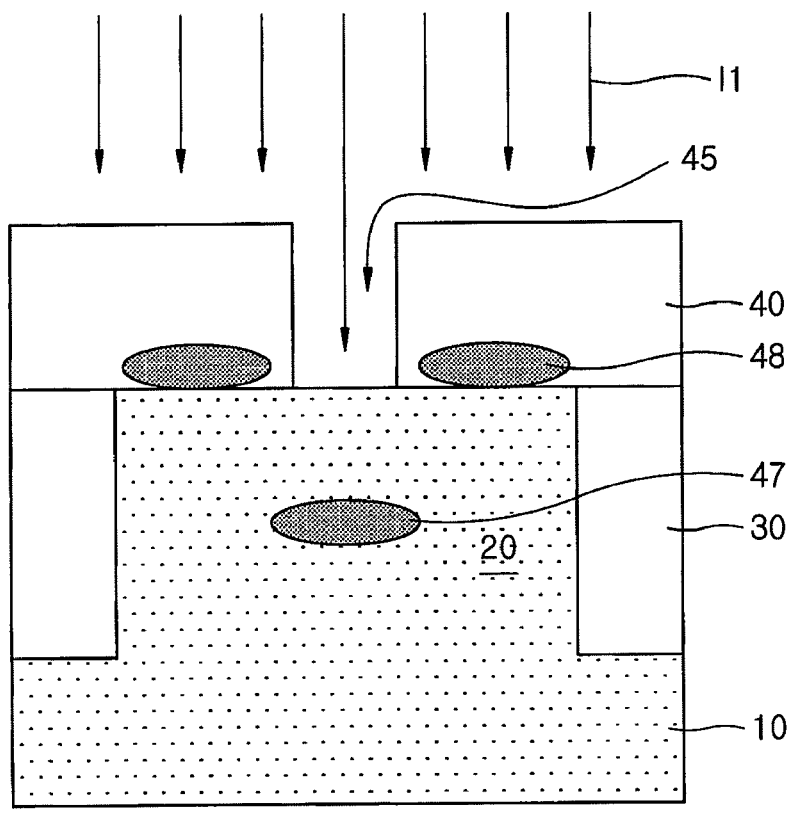
Figure 12:
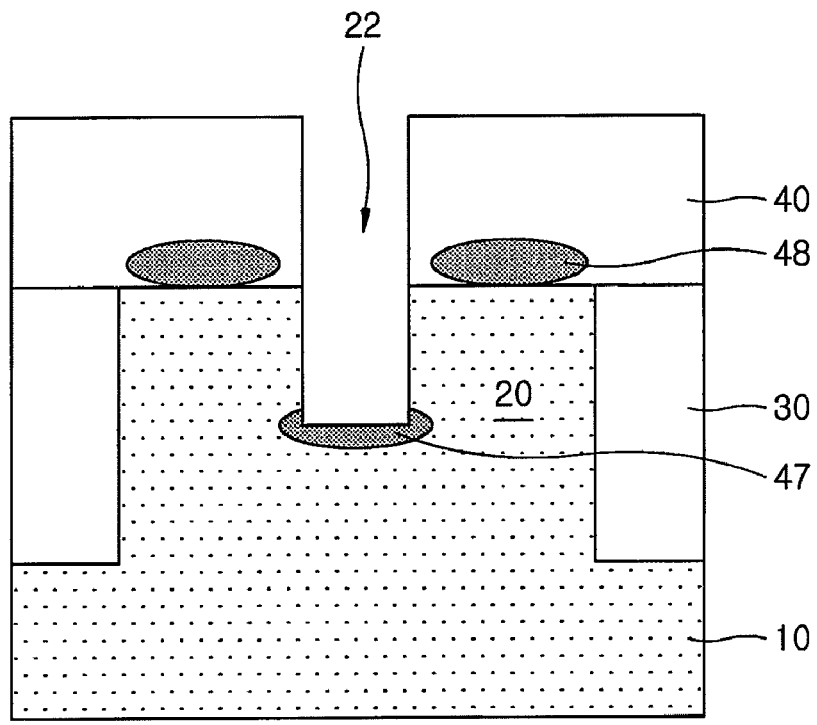

Referring to FIGS. 2 through 17, a method of fabricating a semiconductor device having the layout illustrated in FIG. 1 according to a first embodiment of the present invention will be described. FIGS. 2 through 6, FIG. 8, FIG. 9, FIG. 13 and FIG. 15 illustrate intermediary structures. FIG. 7 is a sectional view taken along a line VII-VII' of FIG. 6. FIGS. 10 through 12 are sectional views taken along a line X-X' of FIG. 9, in which FIGS. 10 and 11 correspond to a structure illustrated in FIG. 9, and FIG. 12 illustrates a step subsequent to FIG. 11. FIG. 14 is a sectional view taken along a line XIV-XIV' of FIG. 13. FIG. 16 is a sectional view taken along the line XVI-XVI' of FIG. 15, corresponding to the structure of FIG. 15.

Figure 2:
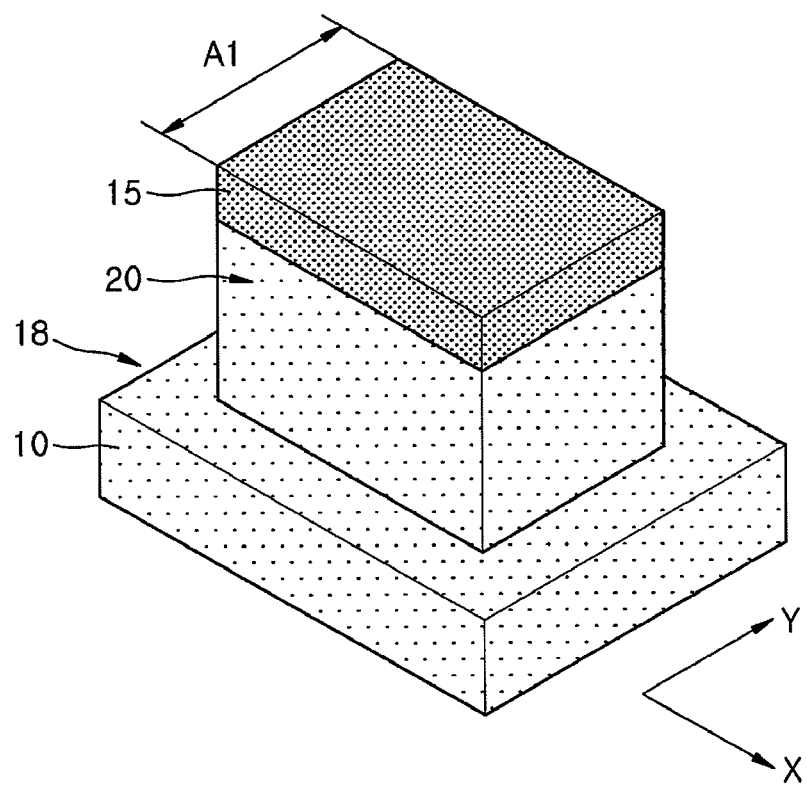
FIGS. 2 through 6, FIG. 8, FIG. 9, FIG. 13 and FIG. 15 illustrate intermediary structures for illustrating the method of fabricating a semiconductor device with the layout as illustrated in FIG. 1 according to the first embodiment of the present invention.

First, referring to FIG. 2, an active region hard mask 15 is formed on a semiconductor substrate 10 such as a p-type bulk silicon wafer so as to define the active region 20 as illustrated in FIG. 1. Instead of the silicon wafer, a Silicon-On-Insulator (SOI) substrate, a Silicon Germanium-On-Insulator (SGOI) substrate or a Silicon Germanium (SiGe) wafer may optionally be used as the silicon substrate 10. When compared with an SOI or an SGOI substrate, the bulk silicon substrate can economize manufacturing costs and does not have problems such as a floating body effect or lowering of a breakdown voltage between a drain and a source which are liable to occur in the SOI or SGOI MOSFET device. Meantime, the SOI or SGOI substrate prevents a bottom channel from conducting. Also, the SGOI or SiGe substrate has an advantage of utilizing a high charge mobility of a substrate material. The active region hard mask 15 is formed by depositing an insulating layer such as a silicon nitride layer or a silicon oxide nitride layer on the substrate 10 via Plasma Enhanced-Chemical Vapor Deposition (PE-CVD) or Low Pressure-CVD (LPCVD), and is then patterned in a predetermined shape. The active region hard mask 15 can be composed, for example, of silicon nitride. The active region hard mask 15 has a predetermined linewidth A1 in the Y-direction and extends in the X-direction. If stress is likely to occur between the active region hard mask 15 and the substrate 10, an oxide layer may be formed between the active region hard mask 15 and the substrate 10 by thermal oxidation. Thereafter, the substrate 10 is etched using the active region hard mask 15 as an etch mask. In doing so, a trench 18 that defines the active region 20 projecting from the surface of the substrate 10 and surrounds the active region 20 is formed.

Figure 3:
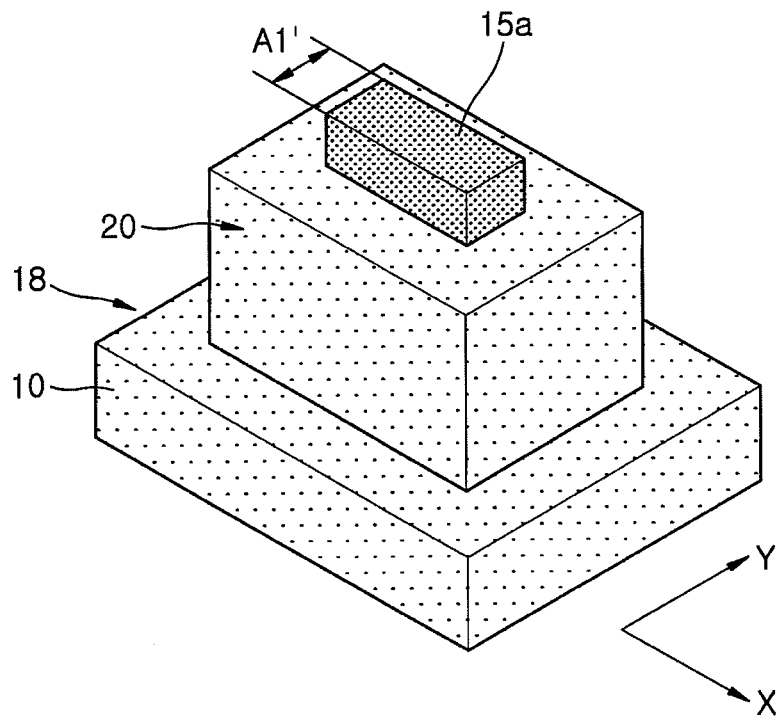

Referring to FIG. 3, the active region hard mask 15 is isotropically etched. Thus, a hard mask pattern 15a smaller than the active region hard mask 15 is formed, and a marginal surface of the active region 20 is exposed. In this case, isotropic etching denotes blanket etching the active region hard mask 15 without using an etch mask, and can also be referred to as a pull back procedure. In the case where the active region hard mask 15 is composed of silicon nitride, the isotropic etching may be wet etching using $H_3PO_4$ or dry etching using plasma. Providing that the linewidth in the Y-direction of the hard mask pattern 15a is A1', a width of a fin that will be used as a channel later is determined to be A1-A1'. The smaller the linewidth A1' of the hard mask pattern 15a, the larger the fin is. Accordingly, the width of the fin is adjusted by controlling the isotropic etching (i.e., pull back) time.

Figure 4:
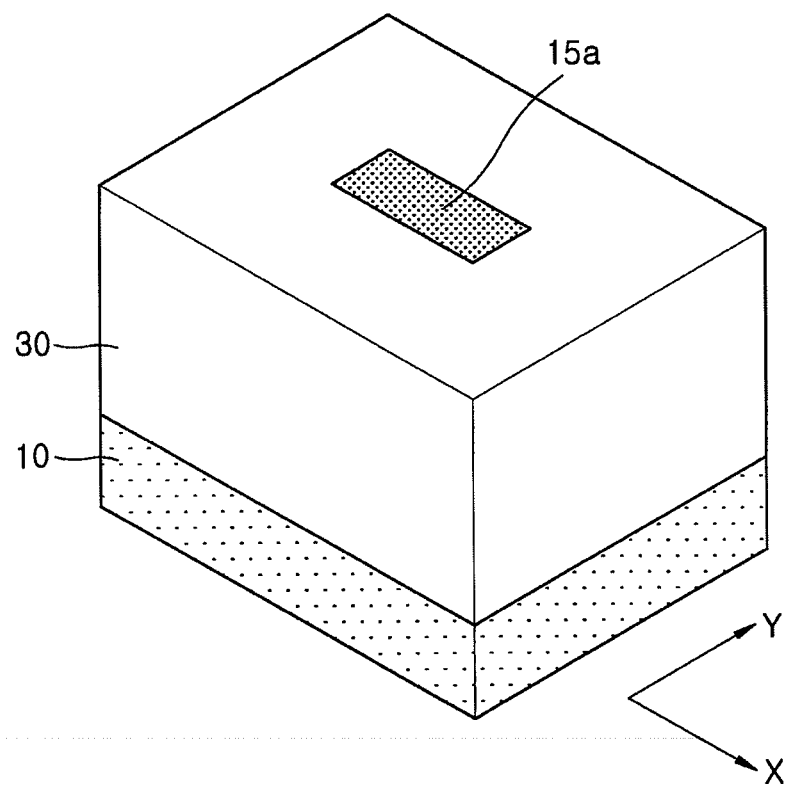

Referring to FIG. 4, the trench 18 is filled with an insulating material, e.g., a gap fill oxide layer 30, and planarization is performed using the hard mask pattern 15a as an end point of the planarization. The gap fill oxide layer 30 can be deposited using, e.g., High Density Plasma (HDP)-CVD, and can be planarized by Chemical mechanical Polishing (CMP) or blanket etching. Ceria slurry may be used to planarize the gap fill oxide layer 30 when CMP is used.

Figure 5:
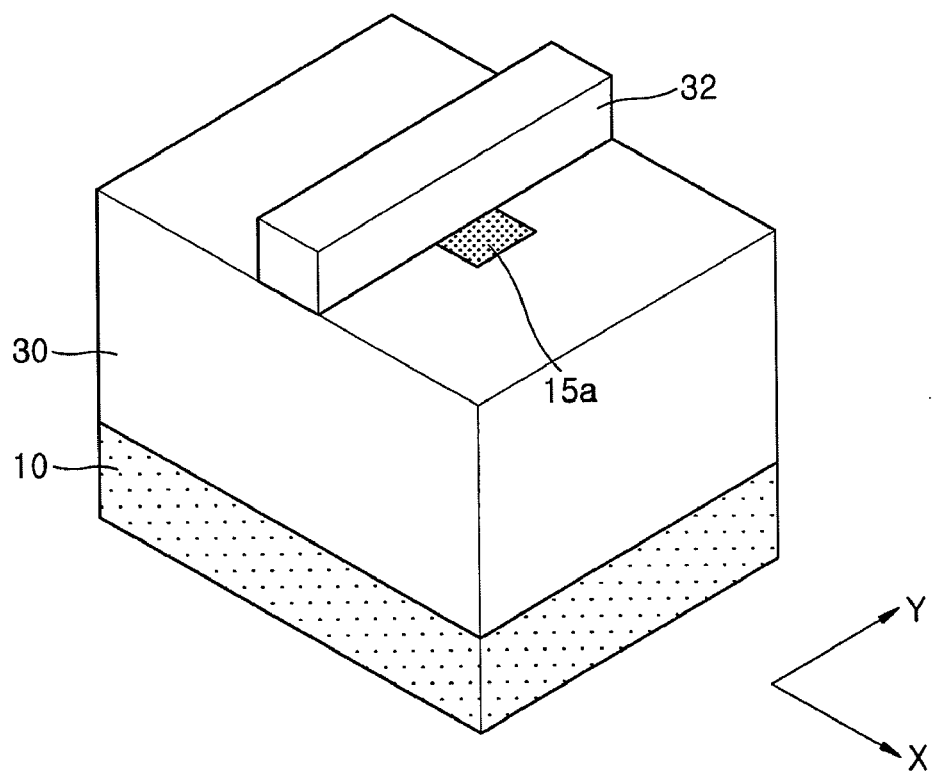

After depositing an insulating layer such as a silicon oxide nitride layer on the resultant structure obtained in FIG. 4, photolithography is performed to form a line type mask 32 extending over the gap fill oxide layer 30 and the hard mask pattern 15a as illustrated in FIG. 5. The line type mask 32 is formed on a portion corresponding to the eventual gate electrode 60 extending in the Y-direction as illustrated in FIG. 1.

Figure 6:
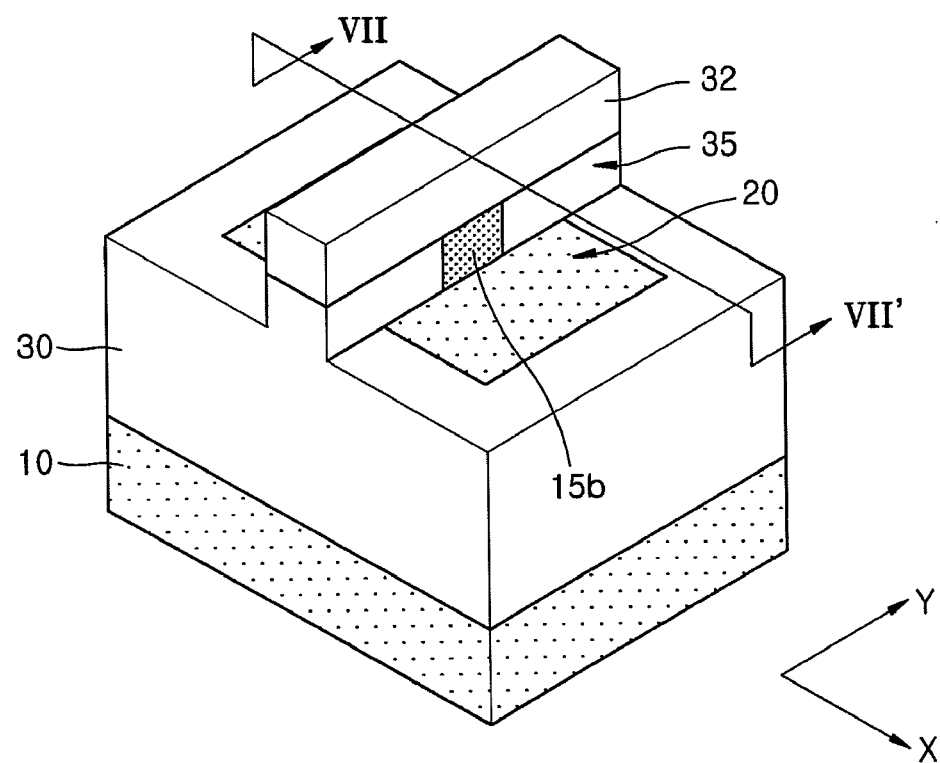
Figure 7:
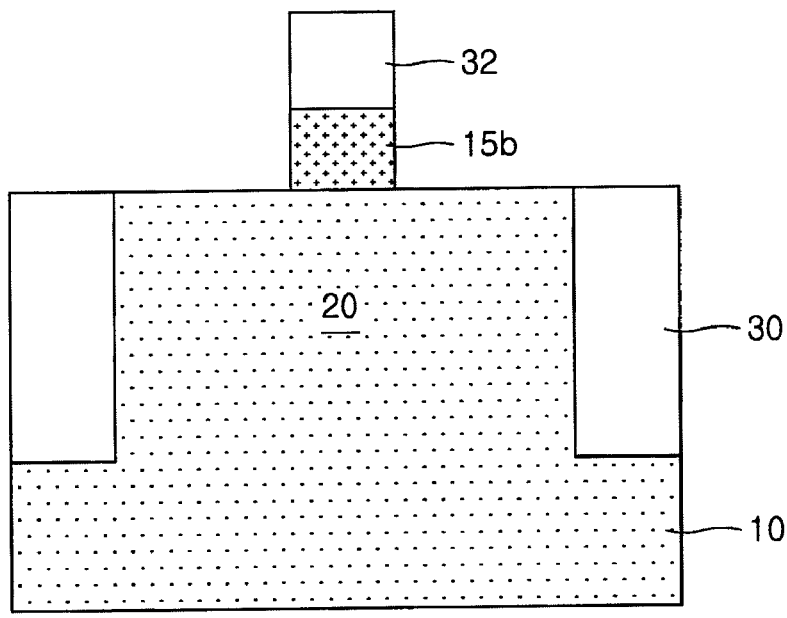
FIG. 7 is a sectional view taken along a line VII-VII' of FIG. 6.

Referring to FIGS. 6 and 7, the gap fill oxide layer 30 and the hard mask pattern 15a are patterned using the line type mask 32 as an etch mask, thereby forming a dummy pattern 35. At this time, the gap fill oxide layer 30 and the hard mask pattern 15a may be etched under a same or a similar etch selectivity condition. By forming the dummy pattern 35, almost all of the hard mask pattern 15a is removed, and a single channel region defining pattern 15b is formed on the center of the active region 20, and the active region 20 is partially exposed under the dummy pattern 35. Here, the line type mask 32 and the channel region defining pattern 15b are referred to as a dummy gate. The dummy gate can be made to extend over the active region 20. Furthermore, when the channel region defining pattern 15b is composed of a silicon nitride layer and the line type mask 32 is composed of a silicon oxide nitride layer, the dummy gate may be formed by combining the silicon nitride layer and the silicon oxide nitride layer. A sum of the heights of the line type mask 32 and the channel region defining pattern 15b, i.e., a height of the dummy gate, may be equal to or larger than the depths of a source region and a drain region formed in a subsequent process.

Figure 8:
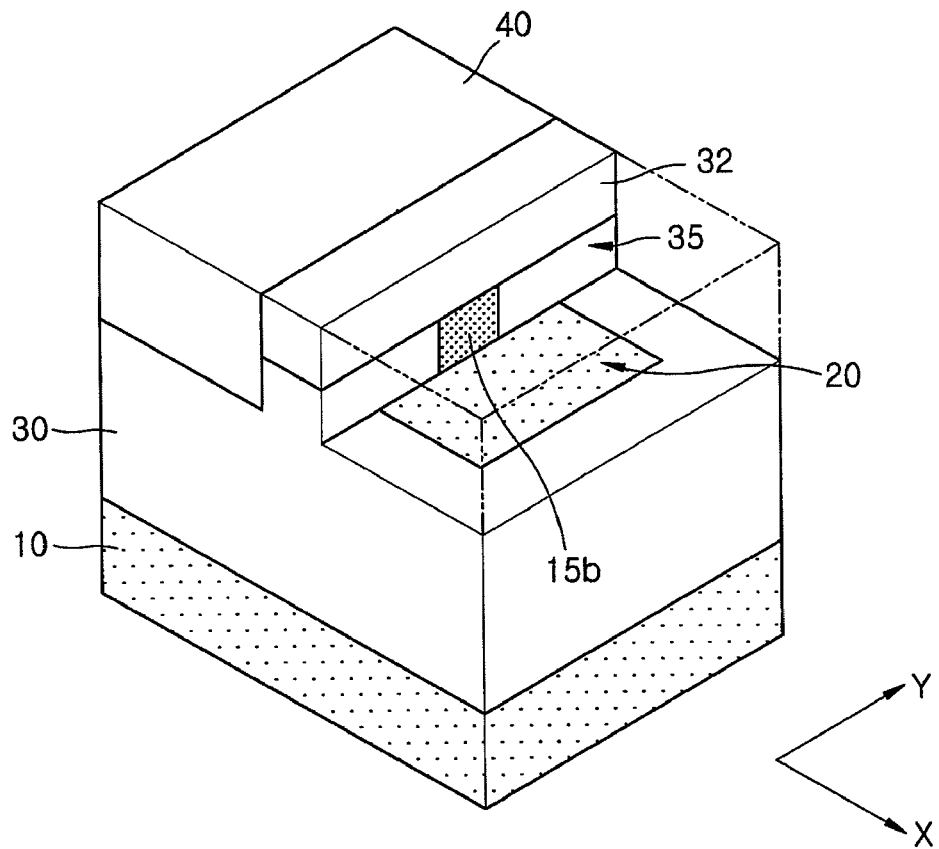

Referring to FIG. 8, a shielding layer 40 such as a silicon oxide layer is deposited on the line type mask 32 of FIG. 6, and is planarized using the line type mask 32 as an end point of planarization. The shield layer 40 can be deposited using, for example, HDP-CVD when depositing the gap fill oxide layer 30. When planarizing the shielding layer 40, CMP or blanket etching suitable for planarizing the gap fill oxide layer 30 can be employed. Because the shielding layer 40 and the gap fill oxide layer 30 are composed of a similar or of the same kind of oxide layer, no interface may actually exist between the two layers. However, a virtual interfacial position is denoted by a line in the figures for assisting understanding of the present invention.

The present invention is characterized by forming the shielding layer 40 without removing the line type mask 32 used when patterning the channel region defining pattern 15b. Since the shielding layer 40 can be formed to be relatively thick using this method, an implanted depth of an impurity doped in the active region 20 corresponding to the source and drain regions is reduced during subsequent local channel ion implantation. Therefore, an ion doped region that is exclusive of the channel ion implantation layer can remain on the surface of the active region 20 or in the shielding layer 40.

Referring to FIGS. 9 and 10, the line type mask 32 and the channel region defining pattern 15b are removed with a high selectivity to the shielding layer 40 via wet or dry etching, thereby forming an opening 45 that exposes a surface of the active region 20. If the line type mask 32 is composed of a silicon oxide nitride layer and the channel region defining pattern 15b is composed of a silicon nitride layer, phosphoric acid stripping may be used when the line type mask 32 and the channel region defining pattern 15b are removed by wet etching. By doing so, the opening 45 is formed where the channel region defining pattern 15b is disposed, and an underlying surface of the substrate 10, i.e., the surface of the active region 20, is partially exposed.

Referring to FIG. 11, p-type impurity local channel ion implantation I1 is performed via the opening 45 to form a p-type channel ion implantation layer 47 within the active region 20. In this case, the shielding layer 40 is used as an ion implantation mask. The gap fill oxide layer 30 may be used as the ion implantation mask together with the shielding layer 40. Also, local channel ion implantation I1 is performed in a direction that is perpendicular to the substrate 10, and not at an inclined angle. In the present invention, since the shielding layer 40 is formed without removing the line type mask 32, the shielding layer 40 is relatively thick. Accordingly, by adjusting the doping energy of the local channel ion implantation I1, impurities injected through the shielding layer 40, i.e., impurities that are exclusive of the impurities that form the channel ion implantation layer 47, are transported into the shielding layer 40 or in the surface of the active region 20, while forming the channel ion implantation layer 47 with the impurities transported through the opening 45. As shown in the drawings, the impurities exclusive of the impurities that constitute the channel ion implantation layer 47 form a p-type ion implantation region 48 within the shielding layer 40.

If the p-type ion implantation region 48 is formed entirely within the shielding layer 40, the p-type ion implantation region 48 is removed altogether during removal of the shielding layer 40 in a subsequent process. Therefore, there is no danger of the p-type ion implantation contacting a subsequently formed n-type source and drain of the active region. On the other hand, if the p-type ion implantation region 48 is formed in the surface of the active region 20, the p-type ion implantation region 48 is encompassed by the subsequently formed n-type source and drain regions. As described above, due to the height of the shielding layer that is present during p-type ion implantation, the p-type ion implantation region 48 exclusive of the channel ion implantation layer 47 avoids contact with bottom surfaces of the subsequently formed source and drain of opposite conductivity type, but can be included in the source and the drain. Consequently, by avoiding contact with bottom surfaces of the source and drain, undesired increase of the off leakage current caused by the local channel ion implantation is mitigated or eliminated.

Referring to FIG. 12, the active region 20 under the opening 45 is etched using the shielding layer 40 and the gap fill oxide layer 30 as etch masks to form a central trench 22, thereby defining a portion of the active region 20 which is to be used as a fin channel. The central trench 22 is formed to expose the channel ion implantation layer 47. As mentioned above, a width of the resulting fin is determined by a difference between the width A1 of the active region 20 in the Y-direction and the width A1' of the hard mask pattern 15a in the Y-direction, i.e., a difference A1-A1' between the width A1 of the active region hard mask 15 in the Y-direction and the width A1' of the channel region defining pattern 15b in the Y-direction.

Figure 13:
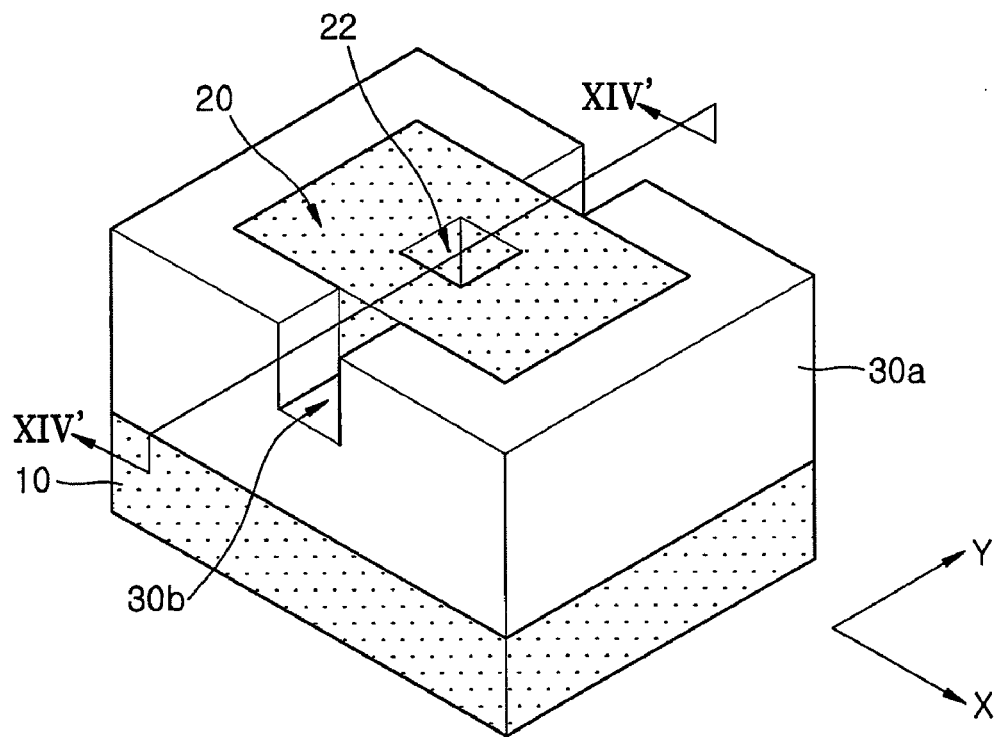
Figure 14:
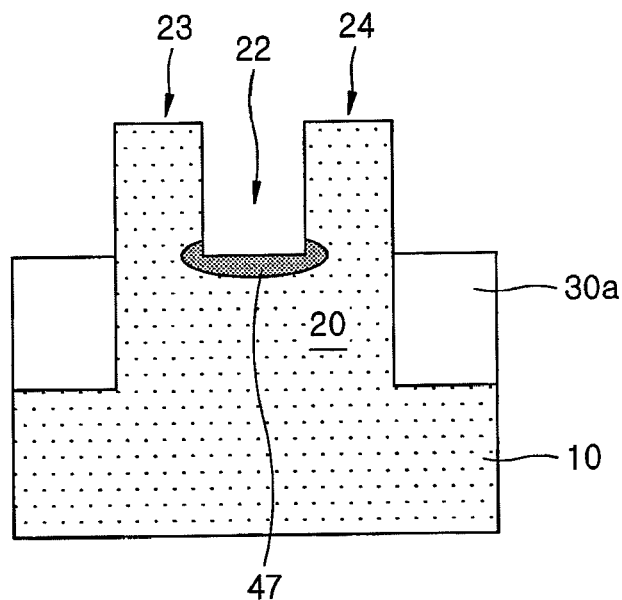
FIG. 14 is a sectional view taken along a line XIV-XIV' of FIG. 13.

Referring to FIGS. 13 and 14, the shielding layer 40 is removed and the gap fill oxide layer 30 is recessed. HF diluted solution or Buffered Oxide Etchant (BOE) solution may be used to recess the shielding layer 40 and the gap fill oxide layer 30 by wet etching. A device isolating layer 30a is formed around the active region 20 exposed by the recessing step.

Referring to FIG. 14, a first projection 23 and a second projection 24 composed of the substrate 10 between the central trench 22 and the device isolating region 30a in the active region 20 are exposed. The upper surfaces and the side surfaces of the first projection 23 and the second projection 24 provide a three-dimensionally structured channel region, and are parallel with each other by centering about the central trench 22. Because recessing is carried out under the condition that the surfaces of the stacked layers consisting of the shielding layer 40 and the gap fill oxide layer 30 are stepped as illustrated in FIG. 9, the device isolating layer 30a that is the final resultant structure may have indented portions 30b that expose the side surfaces of the first projection 23 and the second projection 24 as illustrated in FIG. 13.

Figure 15:
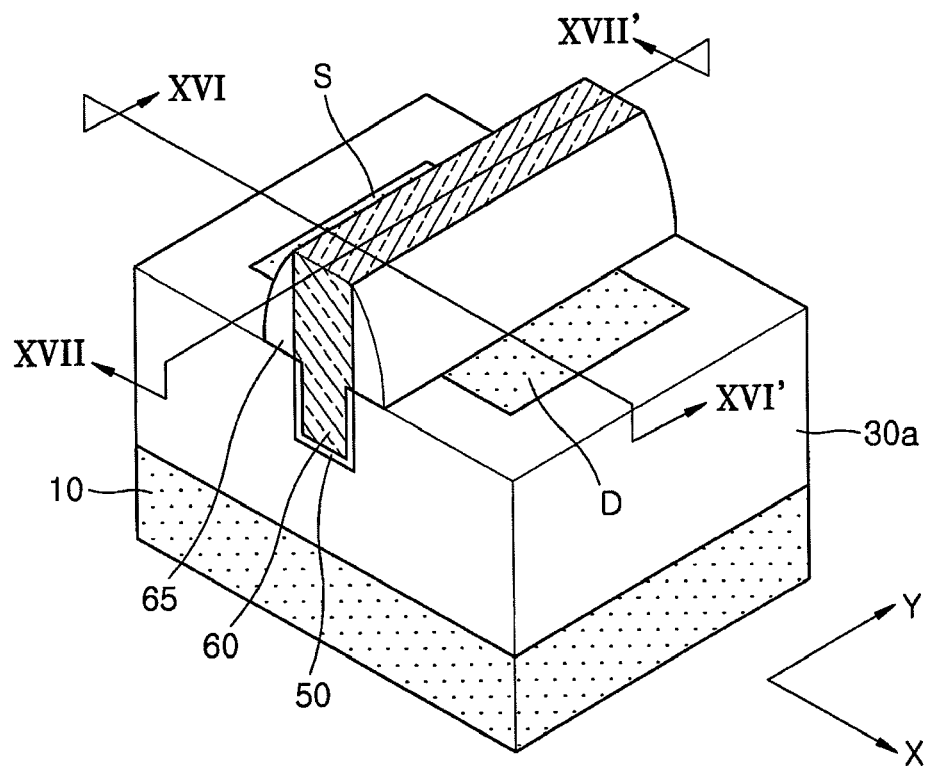
Figure 16:
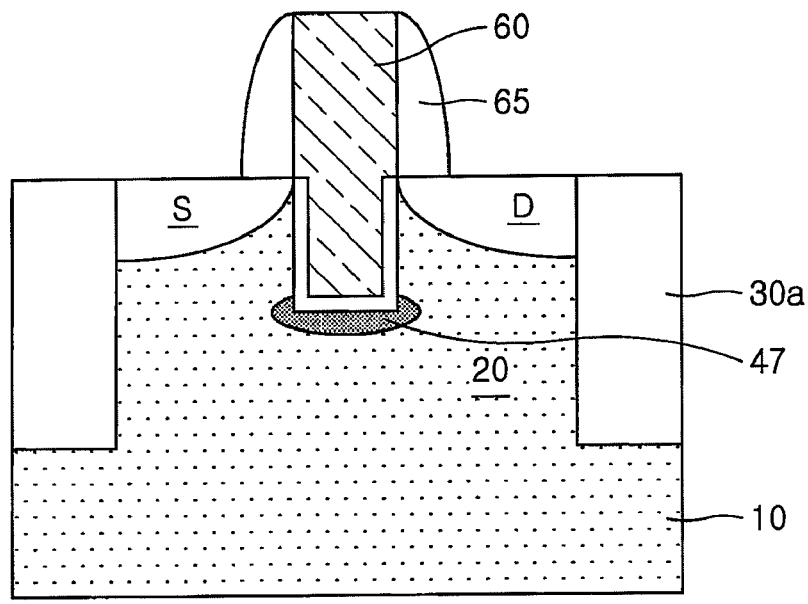
FIG. 16 is a sectional view taken along the line XVI-XVI' of FIG. 15, illustrating the structure of FIG. 15.
Figure 17:
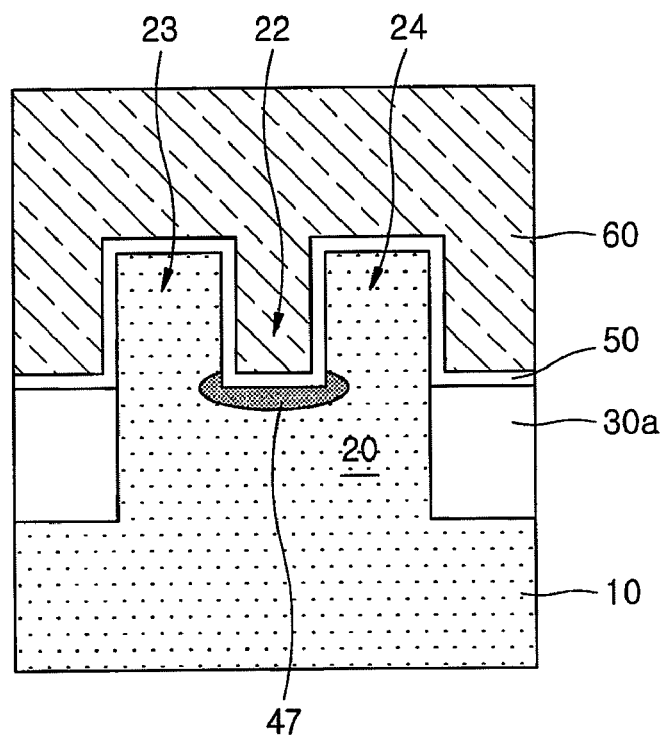
FIG. 17 is a sectional view taken along a line XVII-XVII' of FIG. 15.

Referring to FIGS. 15 through 17, a gate oxide layer 50 is formed to a thickness of 10 Å to 70 Å on the active region 20. The gate oxide layer 50 can be formed, for example, by growing a silicon oxide layer via thermal oxidation. Alternatively, an insulating material layer, e.g., a silicon oxide layer, a hafnium oxide layer, a zirconium oxide layer or an aluminum oxide layer, may be deposited or coated by Atomic Layer Deposition (ALD), CVD, Plasma Enhanced-ALD (PE-ALD) or PE-CVD. Thereafter, a gate electrode 60 extending in the Y-direction corresponding to the gate electrode 60 of FIG. 1 is formed on the gate oxide layer 50. The gate electrode 60 is composed of a doped polysilicon layer that is patterned to extend in the Y-direction. Here, the gate electrode 60 has a width equal to or greater than that of the central trench 22, and traverses the channel region while covering the upper surfaces and the side surfaces of the first projection 23 and the second projection 24. The dimension of the central trench 22 is determined by the dimension of the opening 45. In turn, the dimension of the opening 45 is determined by the dimension of the channel region defining pattern 15b. Accordingly, in order to increase the resulting respective areas of the source and the drain, the channel region defining pattern 15b should be as small as possible.

Subsequently, a gate spacer 65 is formed on the sidewalls of the gate electrode 60. The gate spacer 65 may be composed of a silicon nitride layer. When thermal treatment is performed after n-type source/drain ion implantation is performed by self-alignment using the gate electrode 60 and the gate spacer 65, a source S and a drain D are formed in the active region 20 on both sides of the gate electrode 60. The source S and the drain D regions may be of a Lightly Doped Drain (LDD) type. In this case, the source S and drain D regions are formed using a high density ion implanting (range of between $E12/cm^2 \sim E15/cm^2$).

In the present invention as described above, the shielding layer 40 is formed without removing the line type mask 32 used for patterning the channel region defining pattern 15b, and the resulting shielding layer 40 is relatively thick. In addition, the doping energy of the local channel ion implanting I1 (see FIG. 11) is adjusted to allow the impurities that penetrate the active region 20 via the opening 45 to form the p-type channel ion implantation layer 47 and to allow the remaining impurity to form the ion implantation regions 48 within the shielding layer 40. Because the p-type ion implantation regions 48 are removed together with the removal of the shielding layer 40 during subsequent processing, there is no danger of such regions 48 coming in contact with the subsequently formed source and drain regions. The p-type ion implantation regions 48 can be formed deep enough in the shielding layer 40 to penetrate the surface of the active region 20. In this case, the p-type ion implantation regions 48 are included in top portions of the subsequently formed source and drain regions. In this case, however, because of the thickness of the shielding layer 40 present when the p-type ion implantation regions 48 are formed during formation of the channel ion implantation layer 47, the p-type ion implantation regions 48 neither contact the bottom surfaces of the source and the drain of opposite conductivity type nor do they increase the off leakage current of the device.

As illustrated in FIGS. 15 through 17, the resulting semiconductor device includes the semiconductor substrate 10, and the active region 20 formed on the semiconductor substrate 10 which projects from the surface of the substrate 10. The fins that include the first projection 23 and the second projection 24 composed of the substrate 10 are substantially centered about the central trench 22 and parallel with each other and are defined in the active region 20 of the substrate. The upper surfaces and the side surfaces of the first and second projections 23 and 24 are used as the channel regions of the device. The channel ion implantation layer 47 is formed in the lower portion of the fin at the bottom of the central trench 22. The gate electrode 60 is formed on the fin and the gate oxide layer 50 is interposed therebetween, and the source S and the drain D are formed in the active region 20 on both sides of the gate electrode 60. The device isolating layer 30a around the active region 20 includes the indented portions 30b (see FIG. 13) that expose the side surfaces of the first projection 23 and the second projection 24. The gate electrode 60 has a width that is equal to or greater than the width of the central trench 22 and extends to cover the upper surfaces and the side surfaces of the first projection 23 and the second projection 24. Because the channel ion implantation layer 47 is formed in the lower portion of the fin, the short channel effect can be reduced in the device. Moreover, there is no ion implantation region of opposite conductivity type contacting the bottom surfaces of the source S and the drain D regions, so that the off leakage current is not increased.

Second Embodiment

Figure 18:
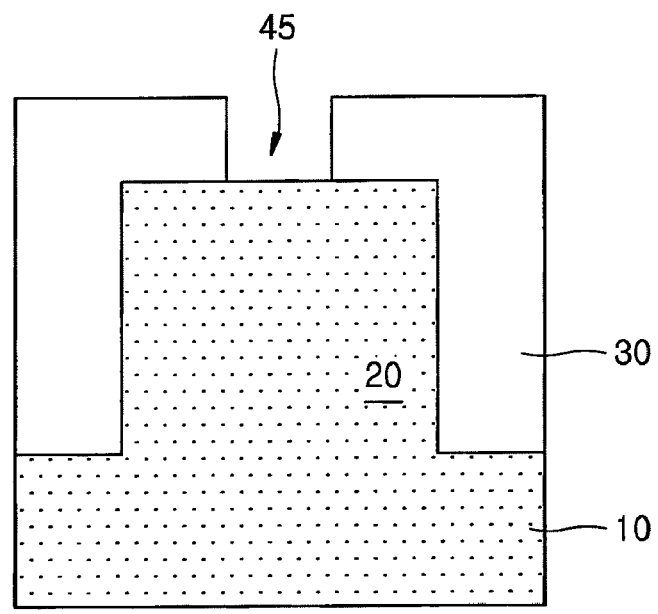
FIGS. 18 through 22 are sectional views illustrating the method of fabricating a semiconductor device according to the second embodiment of the present invention.

FIGS. 18 through 22 are sectional views illustrating a method of fabricating the semiconductor device according to the second embodiment of the present invention, which correspond to the section taken along line XVIII-XVIII' of FIG. 9. Reference numerals in FIG. 18 are similar to elements in FIGS. 2 through 17, and thus their descriptions will be omitted.

The structures illustrated with reference to FIGS. 2 through 10 are identical to those of the first embodiment. The structure illustrated in FIG. 18 corresponds to structures illustrated in FIGS. 9 and 10, and is presented for reference.

Figure 19:
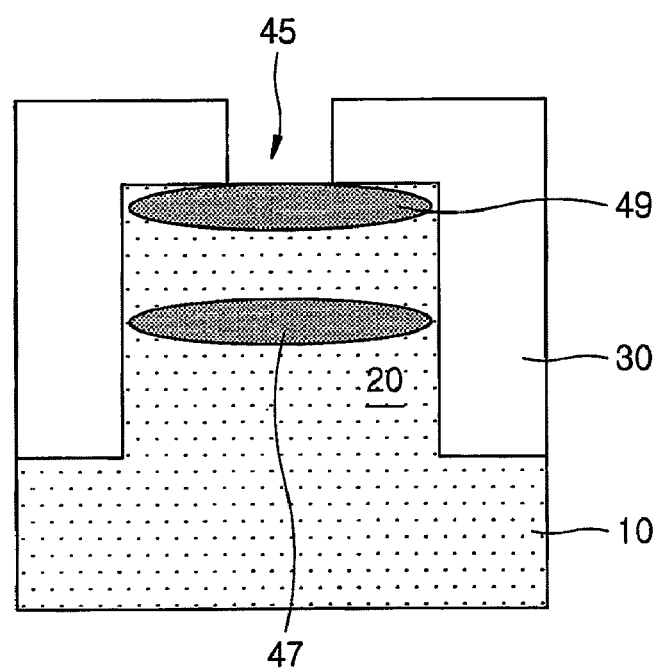

Referring to FIG. 19, the channel ion implantation layer 47 is formed in the active region 20 by local channel ion implanting via the opening 45. In this case, the shielding layer 40 (not shown due to the sectional position) is used as an ion implantation mask. Further to the shielding layer, the gap fill oxide layer 30 may be used as the ion implantation mask. Thereafter, an impurity of conductivity type opposite to that of the impurity of the channel ion implantation layer 47 is doped into the upper portion of the active region 20, thereby forming a threshold voltage controlling ion implantation layer 49. This is referred to as counter doping.

When forming the threshold voltage controlling ion implantation layer 49, the unshown shielding layer 40 is used as the ion implantation mask. Otherwise, the shielding layer 40 (not shown) and the gap fill oxide layer 30 are used as the ion implantation masks. The doping energy is preferably adjusted so as to allow an impurity exclusive of the impurity that constitutes the threshold voltage controlling ion implantation layer 49 to be doped within the shielding layer 40 or the gap fill oxide layer 30.

Figure 20:
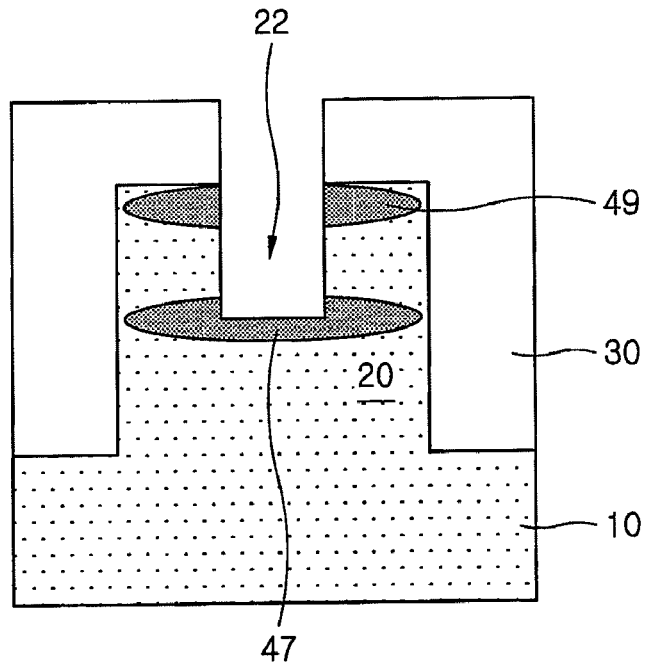

Referring to FIG. 20, the portion that will be used as the fin channel is defined by etching the active region 20 under the opening 45 using the shielding layer 40 (not shown) and the gap fill oxide layer 30 as etch masks to form the central trench 22. The central trench 22 is formed to expose the channel ion implantation layer 47.

Figure 21:
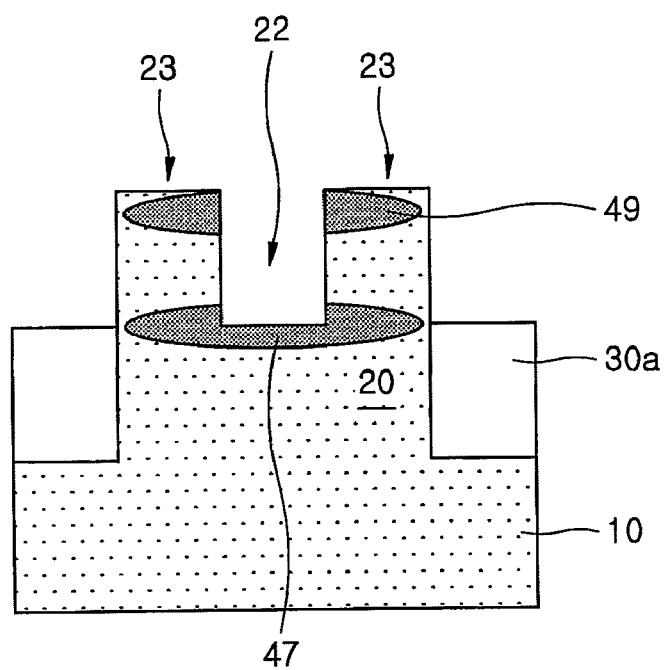

The shielding layer 40 and the gap fill oxide layer 30 recessed to form the device isolating layer 30a around the active region 20 as described with reference to FIGS. 13 and 14 are illustrated in FIG. 21. Although FIG. 21 is similar to FIG. 14, the threshold voltage controlling ion implantation layer 49 is further included on the upper portion of the fin in FIG. 21.

Figure 22:
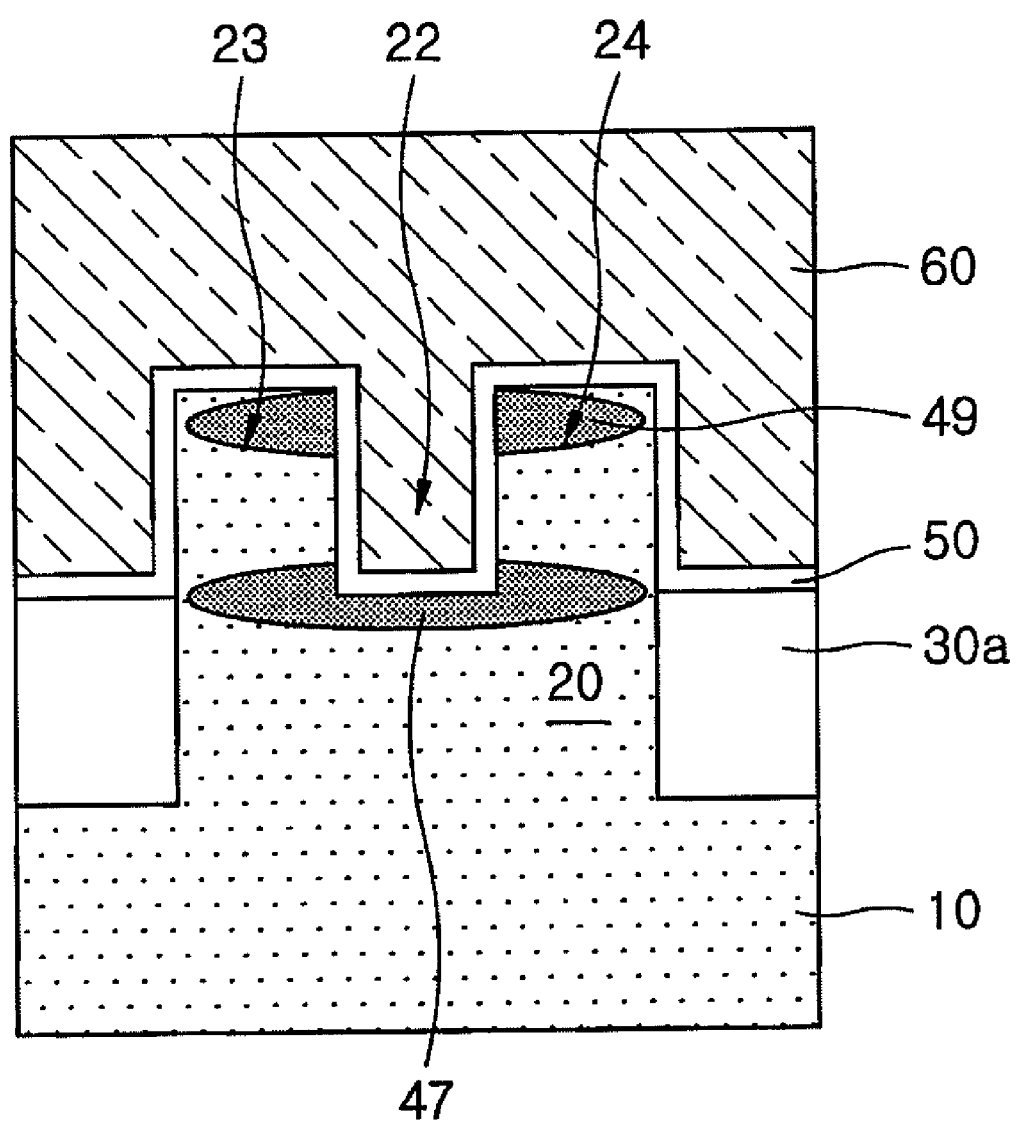

FIG. 22 illustrates the resultant device structure having the gate oxide layer 50, the gate electrode 60 and the source and the drain (not shown due to the sectional position) as illustrated in FIGS. 15 through 17. In the current embodiment, the channel ion implantation layer 47 is formed in the lower portion of the fin, and the threshold voltage controlling ion implantation layer 49 of opposite conductivity type is formed in the upper portion of the fin, thereby lowering the threshold voltage of the device. In particular, since no ion implantation regions of opposite conductivity type formed during the formation the channel ion implantation layer 47 in the lower portion of the fin are in contact with the bottom surfaces of the source and drain regions, the threshold voltage of the device can be lowered without increasing the off leakage current, in contrast with the conventional approach.

As illustrated in FIG. 22, the semiconductor device according to the second embodiment is formed using the structure of the first embodiment, and further includes the threshold voltage controlling ion implantation layer 49 that is doped with the impurities of a conductivity type that are opposite to that of the impurities of the channel ion implantation layer 47. Also, the threshold voltage controlling ion implantation layer 49 is disposed on the upper portion of the fin corresponding to the first projection 23 and the second projection 24.

In the present invention as described above, a central trench is formed within an active region to form a channel with a three-dimensional structure. Thus, device operating speed is increased.

Also, an active region hard mask is isotropically etched to be used as a pattern that defines a channel region. Therefore, a process of separately coating or depositing a material for forming the channel region defining pattern can be omitted to simplify the fabricating process and to reduce manufacturing costs.

Furthermore, since a shielding layer is formed under a condition that a line type mask used for patterning the channel region defining pattern is not removed, the shielding layer is thick. Accordingly, by adjusting the doping energy of the local channel ion implantation, the impurity doped via the opening constitutes the channel ion implantation layer while the remaining impurities constitute ion implantation regions that are formed within the shielding layer or on the surface of the active region. The resulting ion implantation regions either do not come in contact with a subsequently formed source and drain or do not contact bottom portions or surfaces of the source and the drain. Thus, the off leakage current of the device is not increased.

While the present invention has been particularly shown and described with reference to exemplary embodiments thereof, it will be understood by those of ordinary skill in the art that various changes in form and details may be made herein without departing from the spirit and scope of the present invention as defined by the following claims.

What is claimed is:

1. A method of fabricating a semiconductor device comprising:
    forming a dummy gate extending on an active region of a semiconductor substrate;
    providing a shielding layer on the dummy gate and on the active region, and planarizing the shielding layer using the dummy gate as an end point of planarization;
    forming an opening that exposes a surface of the active region;
    performing local channel ion implantation via the opening to form a channel ion implantation layer beneath the surface of the active region exposed by the opening using the shielding layer as an ion implantation mask, the local channel ion implantation layer being formed in a lower portion of the active region;
    after forming the channel ion implantation layer, doping an impurity of a conductivity type opposite that of an impurity of the channel ion implantation layer into an upper portion of the active region to form a threshold voltage controlling ion implantation layer;
    etching the active region under the opening using the shielding layer as an etch mask to form a central trench that exposes the channel ion implantation layer, wherein a portion of the channel ion implantation layer and a portion of the threshold voltage controlling ion implantation layer are removed during the etching of the active region;
    recessing the shielding layer;
    depositing a gate oxide layer in the central trench;
    forming a gate electrode on the gate oxide layer; and
    forming a source region and a drain region in the active region at both sides of the gate electrode.

2. The method of claim 1, wherein a height of the dummy gate is equal to or greater than depths of the source region and the drain region.

3. A method of fabricating a semiconductor device comprising:
    forming an active region hard mask on a semiconductor substrate;
    etching the substrate using the active region hard mask as an etch mask to define an active region projecting from a surface of the substrate and to form a trench encircling the active region;
    isotropically etching the active region hard mask to form a hard mask pattern that exposes a top perimeter of the active region;
    filling the trench with a gap fill oxide layer, and planarizing the gap fill oxide layer using the hard mask pattern as an end point of planarization;
    forming a line type mask extending on the gap fill oxide layer and the hard mask pattern;
    patterning the gap fill oxide layer and the hard mask pattern using the line type mask as an etch mask to form a dummy pattern including at least one channel region defining pattern in a central portion thereof;
    providing a shielding layer on the line type mask, and planarizing the shielding layer using the line type mask as an end point of planarization;
    selectively removing the line type mask and the channel region defining pattern with respect to the shielding layer to form an opening that exposes a surface of the active region;
    local channel ion implanting via the opening to form a channel ion implantation layer beneath the surface of the active region exposed by the opening;
    etching the active region under the opening to form a central trench in a portion of the active region including a fin channel at sides of the central trench, wherein a portion of the channel ion implantation layer is removed during the etching of the active region;
    recessing the shielding layer and the gap fill oxide layer to provide a device isolating layer about the active region, and exposing a fin channel that has a first projection and a second projection composed of a surface of the substrate arranged in parallel and at each side of the central trench between the central trench and the device isolating layer, the upper surface regions and side surface regions of the first projection and the second projection comprising a channel region;
    forming a gate oxide layer on the fin;
    forming a gate electrode on the gate oxide layer; and
    forming a source region and a drain region in the active region at both sides of the gate electrodes.

4. The method of claim 3, wherein a sum of a height of the line type mask and a height of the channel region defining pattern is equal to or greater than depths of the source and the drain.

5. The method of claim 3, wherein in the forming of the channel ion implantation layer, the shielding layer is used as an ion implantation mask.

6. The method of claim 5, wherein a doping energy of the local channel ion implanting is adjusted to allow impurities other than the impurities constituting the channel ion implantation layer to be doped entirely within the shielding layer or to be doped within the shielding layer and an upper surface of the active region.

7. The method of claim 3, after forming the channel ion implantation layer, further comprising doping an impurity of a conductivity type opposite that of the impurity of the channel ion implantation layer into an upper portion of the active region to form a threshold voltage controlling ion implantation layer.

8. The method of claim 7, wherein in the forming of the threshold voltage controlling ion implantation layer the shielding layer is used as an ion implantation mask.

9. The method of claim 8, wherein a doping energy is adjusted to allow impurities other than the impurities constituting the threshold voltage controlling ion implantation layer to be doped within the shielding layer.

10. The method of claim 3, wherein the active region hard mask comprises silicon nitride, and the isotropic etching is wet etching using $H_3PO_4$.

11. The method of claim 3, wherein the isotropic etching is one of wet etching and dry etching using plasma.

12. The method of claim 3, wherein the line type mask comprises silicon oxide nitride.

13. The method of claim 12, wherein the shielding layer comprises silicon oxide.

14. The method of claim 3, wherein the shielding layer comprises High Density Plasma-CVD oxide.

15. The method of claim 3, wherein the device isolating layer is formed to have indented portions that expose side surfaces of the first projection and the second projection.

16. The method of claim 1, wherein the shielding layer is formed directly on the dummy gate and the active region, and wherein a top surface of the shielding layer is directly exposed to the local ion implantation.

17. The method of claim 3 further comprising providing the shielding layer on the active region, wherein the shielding layer is provided directly on the line type mask and the active region, and wherein a top surface of the shielding layer is directly exposed to the local ion implanting.

* * * * *